United States Patent
Fan et al.

(10) Patent No.: US 6,697,192 B1
(45) Date of Patent: *Feb. 24, 2004

(54) HIGH POWER, SPECTRALLY COMBINED LASER SYSTEMS AND RELATED METHODS

(75) Inventors: Tso Yee Fan, Belmont, MA (US); Anish Goyal, Somerville, MA (US); Antonio Sanchez-Rubio, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/708,697

(22) Filed: Nov. 8, 2000

(51) Int. Cl.$^7$ ................................................. H01S 3/00
(52) U.S. Cl. ............... 359/349; 359/341.33; 359/341.3; 359/340; 372/1; 372/6; 372/20; 372/23; 372/92
(58) Field of Search .................. 359/341.33, 341.3, 359/349, 340; 372/1, 23, 6, 20, 92

(56) References Cited

U.S. PATENT DOCUMENTS

| | | | | |
|---|---|---|---|---|
| 3,586,995 A | * | 6/1971 | Hubach | 372/23 |
| 4,264,869 A | * | 4/1981 | Hunter | 359/342 |
| 4,710,937 A | * | 12/1987 | Oomori et al. | 372/53 |
| 4,757,268 A | * | 7/1988 | Abrams | 330/4.3 |
| 4,794,345 A | * | 12/1988 | Linford | 330/4.3 |
| 4,856,010 A | | 8/1989 | Wissman et al. | 372/32 |
| 5,081,637 A | * | 1/1992 | Fan | 372/72 |
| 5,095,487 A | * | 3/1992 | Meyerhofer et al. | 372/102 |
| 5,115,444 A | | 5/1992 | Kirkby et al. | 372/50 |
| 5,163,058 A | | 11/1992 | Farries et al. | 372/6 |
| 5,185,758 A | * | 2/1993 | Fan | 372/72 |
| 5,189,676 A | * | 2/1993 | Wysocki | 372/24 |
| 5,274,657 A | * | 12/1993 | Hori et al. | 372/102 |
| 5,289,485 A | | 2/1994 | Mooradian | 372/45 |
| 5,373,526 A | * | 12/1994 | Lam | 372/69 |
| 5,379,310 A | * | 1/1995 | Papen | 372/23 |
| 5,386,431 A | * | 1/1995 | Tulip | 372/68 |

(List continued on next page.)

FOREIGN PATENT DOCUMENTS

| | | |
|---|---|---|
| FR | 2 630 268 A1 | 4/1988 |
| WO | WO 94/15386 | 7/1994 |

OTHER PUBLICATIONS

Glas, P. et al. "Dynamic Characteristics of a Transient Phase–Coupled and Mode–Locked Fiber–Array Laser." IEEE J. Quantum Elect. 31:9, Sep. 1995, pp. 1619–1625.*
Imec newsletter, No. 27, Jul. 2000 (see specifically p. 10).*
Sumida, D. et al. "A 8.2 J Phase–Conjugate Solid–State Laser Coherently Combining Eight Parallel Amplifiers." IEEE. J. Quantum Elec. vol. 30, No. 111, Nov. 1994. pp. 2617–2627.*

(List continued on next page.)

Primary Examiner—Thomas G. Black
Assistant Examiner—Stephen Cunningham
(74) Attorney, Agent, or Firm—Test, Hurwitz & Thibeault, LLP

(57) ABSTRACT

An external-resonator laser system having multiple laser elements is configured to permit each laser to undergo individual amplification notwithstanding optical beam combination. In this way, overall output power may be scaled in a desired fashion, depending on the selected characteristics of the optical amplifier elements. To achieve additional power, each of the amplifiers may implemented as a phased array. Viewed more generally, a phased-array configuration affords beam combining in two stages, with each contributing input source itself composed of multiple sources whose outputs have been combined. If each phased-array source emits at a different wavelength, this design offers a multi-wavelength output whose power level may be scaled in accordance with the number and character of the devices forming each phased array.

10 Claims, 5 Drawing Sheets

U.S. PATENT DOCUMENTS

| | | | | |
|---|---|---|---|---|
| 5,392,154 | A | * | 2/1995 | Chang .......................... 359/341 |
| 5,440,576 | A | * | 8/1995 | Welch .......................... 372/50 |
| 5,524,012 | A | | 6/1996 | Wang et al. .................... 372/23 |
| 5,594,744 | A | | 1/1997 | Lefevre et al. ................ 372/20 |
| 5,613,058 | A | | 3/1997 | Koppolu et al. ............ 395/376 |
| 5,773,345 | A | * | 6/1998 | Ota ............................. 117/918 |
| 5,784,188 | A | | 7/1998 | Nakamura et al. .......... 359/248 |
| 5,802,084 | A | * | 9/1998 | Bowers ....................... 372/18 |
| 5,805,759 | A | * | 9/1998 | Fukushima ................. 385/140 |
| 5,832,006 | A | * | 11/1998 | Rice ............................. 372/3 |
| 5,832,020 | A | * | 11/1998 | Kong ........................... 372/72 |
| 5,859,945 | A | * | 1/1999 | Kato et al. .................... 385/33 |
| 5,930,030 | A | * | 7/1999 | Scrifes ........................ 359/341 |
| 5,936,763 | A | * | 8/1999 | Mitsuda ...................... 359/341 |
| 5,946,130 | A | * | 8/1999 | Rice ............................. 359/161 |
| 6,014,237 | A | | 1/2000 | Abeles et al. ............... 359/124 |
| 6,018,535 | A | | 1/2000 | Maeda ......................... 372/20 |
| 6,049,554 | A | | 4/2000 | Lang et al. ................... 372/20 |
| 6,061,170 | A | * | 5/2000 | Rice ............................. 359/333 |
| 6,081,369 | A | * | 6/2000 | Waarts ........................ 359/341 |
| 6,118,802 | A | * | 9/2000 | Sanders et al. ............... 372/50 |
| 6,151,160 | A | * | 11/2000 | Ma et al. ................ 359/337.12 |
| 6,167,075 | A | * | 12/2000 | Craig .......................... 372/75 |
| 6,175,579 | B1 | | 1/2001 | Sanford et al. ............... 372/32 |
| 6,192,062 | B1 | | 2/2001 | Sanchez-Rubio et al. ..... 372/92 |
| 6,208,679 | B1 | * | 3/2001 | Sanchez-Rubio ............ 372/92 |
| 6,229,940 | B1 | * | 5/2001 | Rice et al. .................... 385/33 |
| 6,236,666 | B1 | | 5/2001 | Mirov et al. .................. 372/23 |
| 6,256,328 | B1 | | 7/2001 | Delfyett et al. ............... 372/23 |
| 6,327,292 | B1 | * | 12/2001 | Sanchez-Rubio et al. ... 372/102 |
| 6,339,609 | B2 | | 1/2002 | Lefevre ........................ 372/99 |
| 6,359,730 | B2 | * | 3/2002 | Tervonen .................... 359/349 |
| 6,370,170 | B1 | | 4/2002 | Glance ......................... 372/32 |
| 6,370,290 | B1 | | 4/2002 | Ball et al. ..................... 385/14 |
| 6,418,152 | B1 | | 7/2002 | Davis .......................... 372/18 |
| 2001/0036209 | A1 | | 11/2001 | Delfyett et al. ............... 372/23 |

OTHER PUBLICATIONS

No. K.H. et al. "One Dimensional Scaling of 100 Ridge Waveguide Amplifiers." IEEE Photonics Tech Lett. vol. 6, No. 9. pp. 1062–1066.*

Zirngibl et al. "An 18–Channel Multifrequency Laser." Photonics Tech. Lett. 8:7, Jul. 1996, pp. 870–872.

Zhu et al. "Multiwavelength Picosecond Optical Pulse Generation Using and Actively Mode–Locked Multichannel Grating Cavity Laser." J. Lightwave Tech. 13:12, Dec. 1995, pp. 2327–2335.

White, I. H. "A Multichannel Grating Cavity Laser for Wavelength Division Multiplexing Application." J. Lighwave Tech. 9:7, Ju 1991, pp. 893–899.

* cited by examiner

HIGH POWER, SPECTRALLY COMBINED LASER SYSTEMS AND RELATED METHODS

GOVERNMENT FUNDING

This invention was made with government support under Contract No. F19628-95-C-0002 awarded by the U.S. Air Force. The government has certain rights in the invention.

FIELD OF THE INVENTION

The present invention relates generally to high-power laser systems, an in particular to systems that combine the beams of multiple lasers to expand output power and bandwidth.

BACKGROUND OF THE INVENTION

High-power, high-brightness lasers are utilized in a wide variety of industrial, optical, and medical applications. For many such applications laser power is carried by optical fibers, which can be single-mode or multimode in nature, depending on the application. The light-carrying cores of single-mode fibers are narrower than those of multimode fibers. Because light travels more quickly through smaller cores and also suffers less attenuation, single-mode fibers are preferred for applications involving high-frequency light pulses and long travel distances.

In order to couple to a small fiber core (the size of which is typically expressed as an "étendue," i.e., the product of the fiber's core diameter and numerical aperture), a laser must have a small-diameter, narrow-divergence output beam and, therefore, a high brightness level. Unfortunately, typical high-power lasers do not exhibit sufficient brightness levels to permit coupling into single-mode fibers.

Copending U.S. Ser. No. 09/149,610 (filed Sep. 8, 1998) now U.S. Pat. No. 6,208,679 U.S. Ser. No. 09/337,081 (filed Jun. 21, 1999), and U.S. Ser. No. 09/498,462 (filed Feb. 4, 2000) now U.S. Pat. No. 6,192,062 describe external-cavity laser designs that generate coaxially overlapping outputs at multiple wavelengths. For example, an external laser resonator may be based on a bar of light-emitting semiconductor material whose outputs emerge from a linear sequence of stripes along the length of the bar. These outputs pass through an output-coupling lens and strike a dispersive element, such as a diffraction grating. Light dispersed by the dispersive element is reflected by a partial mirror back along the optical path, passing through the lens and returning to the semiconductor outputs, the opposite facets of which are reflective. The resulting feedback produces laser amplification, and light not reflected by the partial mirror represents the output of the system.

The reflective semiconductor facets and the partial mirror together form an ensemble of individual, external-cavity lasers, each with its own optical path. The lens and dispersive element force the individual beams into a coaxial configuration, their paths intercepting at the dispersive element. Moreover, because the beam of each of these lasers strikes the dispersive element at a different angle, each laser has a different optical path and, therefore, resonates at a different wavelength. The overall result is a high-power, multi-wavelength beam with high brightness due to the coaxially overlapping component beams.

Although this configuration produces high output power levels, those levels ultimately depend on the inputs to the system—i.e., the light produced by the semiconductor bar. And because the power of semiconductor emitters is limited, overall system power will be limited as well.

DESCRIPTION OF THE INVENTION

BRIEF SUMMARY OF THE INVENTION

In accordance with the present invention, either or both of two strategies is employed to increase system output. In one approach, the external-resonator design is modified to allow each input to undergo individual amplification notwithstanding optical beam combination. In this way, overall output power may be scaled in a desired fashion, depending on the selected characteristics of the optical amplifier elements.

To achieve additional power, each of the amplifiers may be implemented as a phased array. Viewed more generally, this configuration affords beam combining in two stages, with each contributing input source itself composed of multiple sources whose outputs have been combined. If each phased-array source emits at a different wavelength (i.e., has a different output wavelength profile), this design offers a multi-wavelength output whose power level may be scaled in accordance with the number and character of the devices forming each phased array.

Thus, in one aspect, the invention comprises a multi-wavelength light-generation system based on an optical source that produces a plurality of spatially separated optical outputs having different wavelength profiles. An optical amplifier having a plurality of optical gain elements receives the optical outputs and amplifies them. The amplified outputs are directed onto a dispersive optical device, which spatially combines them in the near and far fields, resulting in a co-propagated multi-spectral output.

In another aspect, the invention comprises a multi-wavelength light-generation system based on a series of phased-array optical gain sources. In particular, each of the gain sources utilizes the combined outputs of a plurality of constituent radiation sources arranged in a phased array. Each of the various phased-array gain sources produces an output having a different wavelength profile. These outputs are spatially combined by a dispersive optical device.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1A:
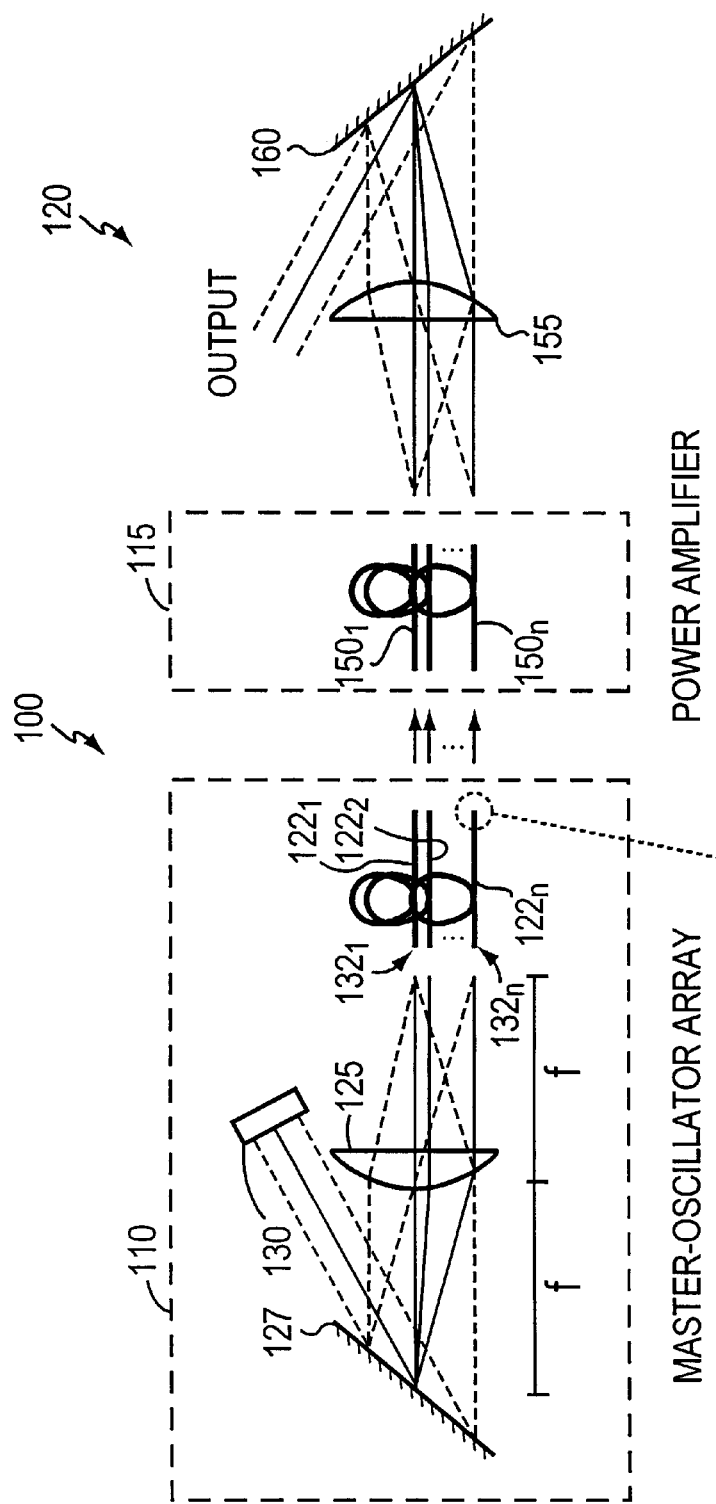
FIG. 1A schematically illustrates an amplified, spectrally combined laser in accordance with the invention.

Refer first to FIG. 1A, which shows an amplified laser 100 in which spectrally distinct outputs are spatially combined. The illustrated design comprises an optical source 110 producing multiple optical outputs having different wavelengths; a power amplifier array 115; and an output stage 120.

In the embodiment shown in FIG. 1A, source 110 is implemented as an external-cavity master-oscillator array. The array includes a set of optical gain elements $122_1 \ldots 122_n$; an optical device (such as a collimating lens and/or a curved mirror) 125; a dispersive element (such as a diffraction grating or prism) 127; and a reflective device (such as a mirror) 130. As illustrated, gain elements 122 are gain fibers, e.g., optical fibers doped with a gain material such as ytterbium (Yb), erbium (Er), or neodymium (Nd). Each fiber has an emission face $132, \ldots 132_n$ and an output face, one of which is representatively shown in enlarged form at $134_n$. The output faces of gain elements 122 are provided with partial-mirror surfaces.

In operation, gain elements 122 are excited so as to emit radiation through (at least) faces 132. This can be achieved in any of various known ways. Typically, each gain element 122 is stimulated with optical radiation delivered by a source fiber. For example, light from the source fiber may be coupled into a gain fiber 122 by fusing the source fiber to the gain fiber in a parallel fashion. Alternatively, a V-groove may be introduced radially into the thickness of a gain fiber 122, and the output of the source fiber directed into the V-groove (i.e., normal to axis of gain fiber 122). In another approach, the gain elements 122 may be excited by application of an electric current (if, for example, the gain elements 122 are semiconductor elements).

In any case, each of the gain elements 122 emits a beam of radiation having a different free-space optical path. The radiation beams from gain elements 122 all pass through optical device 125 and strike dispersive element 127. Optical device 125 causes the radiation beams to overlap as they reach dispersive element 127. For example, device 125 may be a lens positioned substantially a focal-length distance away from both emission faces 132 and dispersive element 127. The light reflected from dispersive element 127 toward mirror 130 is a composite of the individual beams, which emerge from dispersive element 127 coaxially and normal to mirror 130, which is preferably a high reflector.

This configuration forms a resonator. The optical paths of the beams from gain elements 122 all pass through device 125 and are all dispersed by element 127—that is, all beams share device 125 and element 127—but pass through only one of the gain elements 122. Light reflected by mirror 130 and received through one of the emission faces 132 is again partially reflected by the fiber's output face 134, the unreflected portion of the beam representing the output.

The pumped gain media 122 together form an ensemble of individual external-cavity lasers. Because the beam of each of these lasers is incident on dispersive element 127 at a different angle, each lases at a different wavelength. That wavelength, in turn, is determined by the beam's angle of incidence with respect to dispersive element and its angle of diffraction, the optical characteristics of the gain medium, and the grating line spacing of the dispersive element 127. Thus, by varying one or more of these parameters (most simply, the orientation and/or location of dispersive element 127 relative to emission faces 132), the wavelengths of the lasers may be tuned. The tuning range depends on the gain bandwidth of the gain media 122 and the reflectivity of the end faces 134. The number of gain media 122 and their locations can be selected so as to generate simultaneously or sequentially any set of wavelengths within the gain width of the gain media.

Figure 1B:
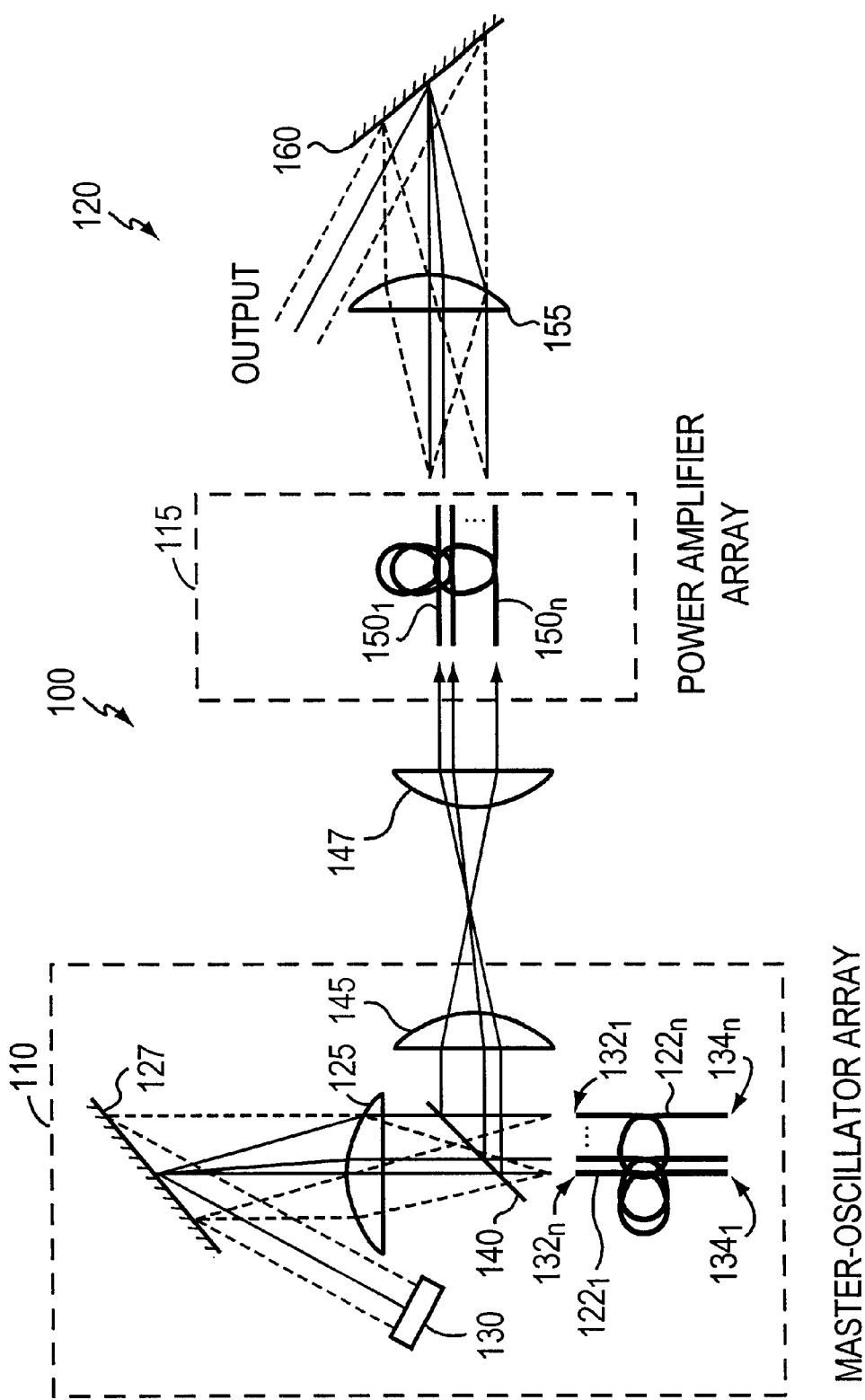
FIG. 1B illustrates a variation of the design shown in FIG. 1A, with output being derived from a different optical location.

In an alternative configuration, shown in FIG. 1B, output is taken from a different optical location within master-oscillator array 110. In particular, a partially reflecting beamsplitter 140 intercepts the beams between optical device 125 and the emission faces 132 of gain fibers 122. In this configuration, the ends 134 of gain fibers 122 are fully rather than partially reflective.

With renewed reference to FIG. 1A, gain elements 122 and amplifier elements 150 are depicted as physically distinct. It is possible, however, for the gain and amplifier elements to be physically connected, with the output ends 134 being internal to the structure. For instance, in the case of optical-fiber gain elements and amplifier elements, fiber Bragg gratings may be used to form a partial reflector for the gain element as well as to differentiate between the gain elements and the amplifier elements.

Regardless of configuration, the individual, wavelength-differentiated outputs of master-oscillator array 110 are provided—either directly or, in the embodiment shown in FIG. 1B, via a pair of lenses 145, 147—to power-amplifier array 115, which comprises a series of individual amplifier elements $150_1 \ldots 150_n$, each receiving a different one of the outputs. Accordingly, different spectral regions are amplified by different ones of the amplifier elements 150. As illustrated, amplifier elements 150 may be optical gain fibers doped, for example, with Yb or Er.

The amplified outputs from array 115 pass through an optical device 155 (e.g., a lens) and strike another dispersive element 160. Optical device 155 causes the radiation beams to overlap as they reach dispersive element 160, and the light reflected from dispersive element 160—representing the ultimate output of the system 100—is a composite of the individual beams, which emerge coaxially. The combination of the optical device 155 and dispersive element 160 forces overlap of the various wavelength outputs in the near and far fields.

Figure 2:
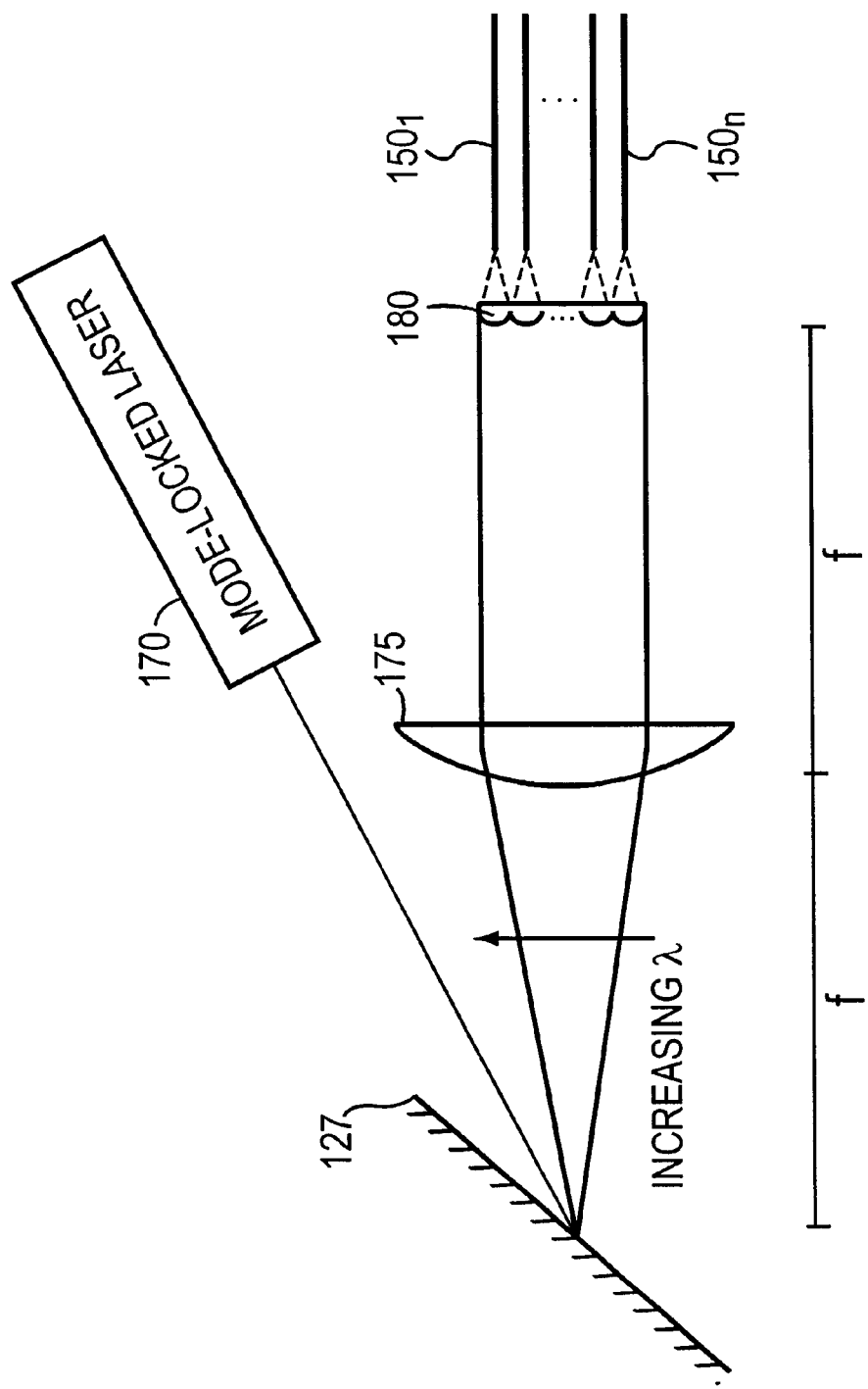
FIG. 2 illustrates implementation of the invention using a mode-locked laser.

It should be stressed that still other configurations are possible for master-oscillator array 110. For example, array 110 may be simply a series of individual, physically distinct laser devices, or may instead not be an array at all—e.g., a single source with multispectral or broadband output that is split so that, once again, different spectral regions are amplified by different amplifier elements 150. This approach is illustrated in FIG. 2 using a mode-locked laser, i.e., a device that outputs a train of short pulses with broad spectral bandwidth. As shown in the figure, the output of a mode-locked laser 170 strikes a dispersive element 127, and the wavelength of light diffracted therefrom varies with angle. A transform lens 175 converts this variation of wavelength with angle to variation with position at the focal plane of the lens, where a microlens array 180 focuses different segments of the beam (and, therefore, different wavelength bands) onto the front faces of optical gain elements $1501 \ldots 150_n$.

Figure 3:
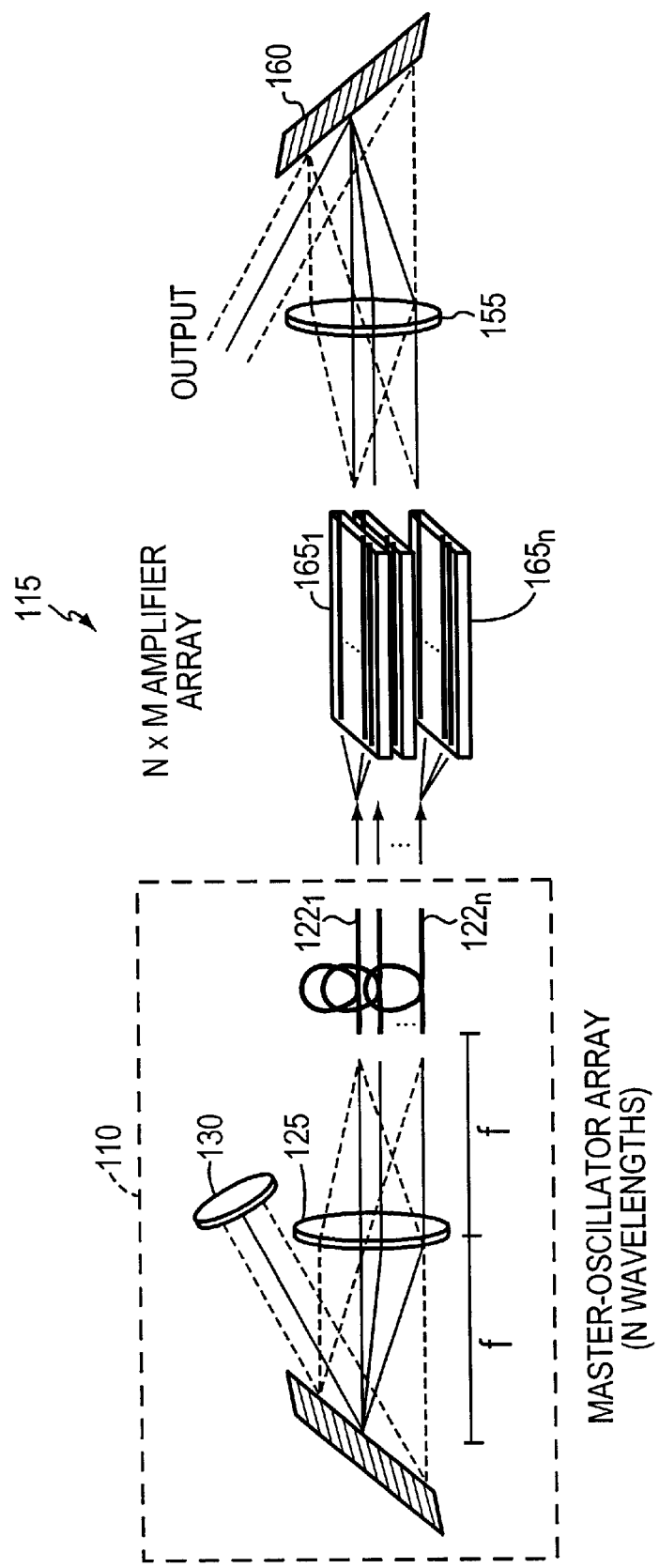
FIG. 3 schematically illustrates an amplified, spectrally combined laser in which the amplifiers are implemented as phased arrays.

As shown in FIG. 3, amplifier array 115 may be realized as a phased array for even greater power. Instead of being received by a single amplifying element, each output of master-oscillator array 110 serves as the input to one of N amplifier phased arrays $165_1 \ldots 165_n$ of 1×M gain elements each (where M may range, for example from 2 to 100). In the implementation illustrated in FIG. 3, a single element 122 and the phased-array amplifier 165 it feeds constitute an individual laser subsystem. The outputs from the amplifier phased arrays 165 are propagated to the dispersive optical system as discussed above.

Amplifier phased arrays suitable for use in the present context are well known. Suitable configurations include ridge waveguide amplifiers (see *IEEE Photonics Tech. Letters* 6:1062 (1994)) and multisection slabs (see *IEEE J. Quantum Electronics* 30:2617 (1994)).

Figure 4:
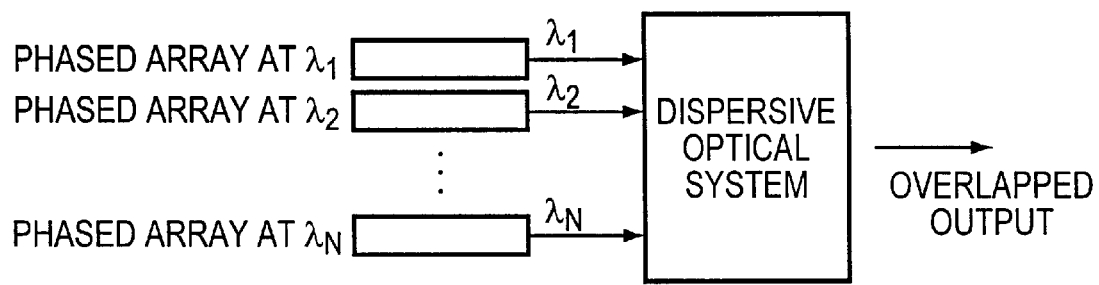
FIG. 4 is a block diagram of a hybrid optical beam-combining system in accordance with the present invention.

As shown more generally in FIG. 4, the combination of phased-array input sources producing spatially and spectrally distinct outputs with a dispersive optical system for combining those outputs in the near and far field offers the possibility of continuous scaling to very large arrays at high output power levels. Moreover, because both beam-combining techniques operate essentially independently, the scaling of one does not place stress on the other. If, for example, the dispersive optics can handle 100 inputs at different wavelengths, and it is possible to configure each input as a phased array of 100 constituent laser elements, the result is a 10,000-element laser system.

Although the present invention has been described with reference to specific details, it is not intended that such details should be regarded as limitations upon the scope of the invention, except as and to the extent that they are included in the accompanying claims.

What is claimed is:

1. A multi-wavelength light-generation system comprising:
   a. a plurality of phased-array optical gain sources, each phased-array optical gain source having an output wavelength, and each phased-array optical gain source comprising a plurality of constituent radiation sources arranged in a phased array and having substantially similar output wavelengths associated with the output wavelength of the phased-array optical gain source, whereby the plurality of constituent radiation sources have outputs that are combined into a phased-array optical gain source output at the output wavelength of the associated phased-array optical gain source, thereby providing a plurality of optical gain source outputs of the plurality of phased-array optical gain sources, the plurality of phased-array optical gain source outputs being spatially separated and having different output wavelengths; and
   b. a dispersive optical device for spatially combining the plurality of phased-array optical gain source outputs.

2. The system of claim 1 wherein the phased-array outputs are substantially overlapped and co-propagated by the dispersive optical device.

3. The system of claim 1 wherein each gain source comprises:
   a. a laser producing a laser output at the output wavelength; and
   b. a phased array of optical amplifiers receiving the laser output and producing the source output therefrom.

4. The system of claim 3 wherein the optical amplifiers are doped optical fibers.

5. The system of claim 4 wherein the optical fibers are doped with Yb, Er or Nd.

6. The system of claim 3 wherein the lasers are constituents of an optical oscillator comprising:
   a. a plurality of optical gain elements each producing one of the laser outputs;
   b. a diffractive element; and
   c. an optical device, light from the optical gain elements being directed by the optical device onto the diffractive element and returned to the optical gain elements so as to force the gain elements to produce the laser outputs at different resonant wavelengths.

7. The system of claim 6 wherein the optical oscillator further comprises a reflector for returning light from the diffractive element to the optical gain elements.

8. The system of claim 6 wherein the optical device is a lens or a mirror having a focal length, the optical device being disposed between the optical gain elements and the diffractive element, a distance substantially equal to the focal length intervening between the diffractive element and the optical device, and between the optical device and the optical gain elements.

9. The system of claim 1 wherein the source comprises:
   a. a single light source producing a multispectral or broadband light output;
   b. a plurality of optical amplifiers, the optical amplifiers being organized into a plurality of phased arrays; and
   c. a spectrum splitter directing different spectral regions of the light output to each of the amplifier phased arrays, whereby each phased array amplifies a different spectral region, the amplifiers collectively producing the phased-array outputs.

10. A multi-wavelength light-generation system comprising:
   an optical source that is an optical oscillator comprising
      a. a plurality of optical gain elements each producing an output,
      b. a diffractive element, and
      c. an optical device, the outputs from the optical gain elements being overlapped and directed by the optical device onto the diffractive element and returned to the optical gain elements so as to force the gain elements to produce the outputs at different resonant wavelengths;
   an optical amplifier comprising a plurality of amplifier elements, the plurality of amplifier elements receiving the optical outputs and producing therefrom a plurality of amplified outputs, wherein the plurality of amplifier elements and the plurality of gain elements are physically connected; and
   a dispersive optical device for spatially combining the plurality of amplified outputs.

* * * * *